(12) United States Patent
Tran et al.

(10) Patent No.: US 6,731,915 B1
(45) Date of Patent: May 4, 2004

(54) COMBINED RF POWER DETECTOR AND POWER PRECORRECTOR

(75) Inventors: Kim Anh Tran, Garland, TX (US); Chia-sam Wey, Arlington, TX (US)

(73) Assignee: Nokia Corporation, Espoo (FI)

( * ) Notice: Subject to any disclaimer, the term of this patent is extended or adjusted under 35 U.S.C. 154(b) by 505 days.

(21) Appl. No.: 09/703,065

(22) Filed: Oct. 31, 2000

(51) Int. Cl.[7] .................................................. H04B 1/04
(52) U.S. Cl. ................ 455/126; 455/127.1; 455/114.1; 455/93; 330/144
(58) Field of Search ................................. 455/126, 127, 455/114, 93, 127.1–127.4, 114.1–114.3, 67.11; 330/144, 279, 278, 291, 149, 124 D; 324/626, 623

(56) References Cited

U.S. PATENT DOCUMENTS

| | | | | |
|---|---|---|---|---|
| 4,811,422 A | * | 3/1989 | Kahn ......................... 455/114 |
| 4,932,075 A | * | 6/1990 | Dimitrijevic et al. ..... 455/67.11 |
| 5,422,598 A | * | 6/1995 | Maeda et al. ............. 455/127.3 |
| 5,644,243 A | * | 7/1997 | Reinhardt et al. ........... 324/626 |
| 5,712,593 A | * | 1/1998 | Buer et al. ................... 330/285 |
| 5,748,678 A | * | 5/1998 | Valentine et al. ........... 455/127 |
| 5,877,653 A | * | 3/1999 | Kim et al. ................... 330/149 |
| 5,909,642 A | * | 6/1999 | Suzuki ........................ 455/126 |
| 5,986,500 A | * | 11/1999 | Park et al. ............... 330/124 D |
| 6,426,822 B1 | * | 7/2002 | Winter et al. ................ 455/126 |
| 6,549,068 B1 | * | 4/2003 | Bollenbeck ................. 330/279 |

* cited by examiner

Primary Examiner—Quochien B. Vuong
Assistant Examiner—Lana Le
(74) Attorney, Agent, or Firm—Squire, Sanders & Dempsey L.L.P.

(57) ABSTRACT

A Power Amplifier (PA) exhibits non-linear characteristics as a result of Amplitude Modulation-Phase Modulation (AM-PM) conversions resulting in intermodulation. Intermodulation affects the RF signal spectrum at the output of the PA. The invention presents a method and apparatus for reducing intermodulation generated at the output of a PA as a result of AM-PM conversion. Presented is a RF power detector utilized in feedback control circuitry where the induction of odd-order harmonics into the feedback path acts to reduce AM-PM intermodulation at the output of the PA. The RF power detector comprises an detector input for receiving RF power and a detector output containing a pre-corrected detected voltage. The RF power detector comprises a pre-correcting circuit for generating odd-order harmonics at a specific power level. The pre-correcting circuit induces odd-order harmonics into the detected portion of output power allowing feedback control circuit to compensate for AM conversions.-PM

16 Claims, 3 Drawing Sheets

COMBINED RF POWER DETECTOR AND POWER PRECORRECTOR

FIELD OF THE INVENTION

The present invention relates, in general, to Radio Frequency (RF) power detectors; and, in particular, to a method and apparatus for suppressing odd-order harmonics responsible for distorting the RF signal spectrum measured at the output of a Power Amplifier (PA).

BACKGROUND OF THE INVENTION

Without limiting the scope of the invention, its background is described in connection with RF power detectors used in power control loops.

A wireless-communication system, for example, a Global System for Mobile (GSM) communications, is a standardized system that defines a common method of communication between a Mobile Station (MS), such as a mobile phone or a mobile computer, and a Base Transceiver Station (BTS). The GSM system uses a Time Division Multiple Accessing (TDMA) signaling mode to utilize the available channel frequencies. The TDMA signaling mode defines a carrier frequency comprising multiple TDMA channels, each TDMA channel having multiple time slots. Each TDMA channel has a duration of 4.615 ms and each timeslot has a duration of 577 $\mu$s. Each time slot carries either speech or control data in a burst form.

The BTS comprises a transceiver comprising a modulator to digitally modulate the carrier frequency with information, such as speech or control data, and a Power Amplifier (PA) to amplify the modulated RF signal. The PA is required to ramp up to a specific power level, output the signal containing information, and to ramp down to a specified power level in a defined amount of time in order to avoid interference with an adjacent time slot. Non-linear components generated by the PA, the transceiver, or any device capable of generating non-linear components affect the ability of the PA to meet operational constraints imposed by the system.

Amplitude Modulation to Amplitude Modulation (AM-AM) and Amplitude Modulation to Phase Modulation (AM-PM) conversion defines amplitude and phase transfer characteristics of the PA. AM-AM and AM-PM describe changes in the output signal amplitude and phase components relative to a change in the input or output signal power. A PA having poor AM-AM and AM-PM conversions will generate non-linear components causing in-band, intermodulation. In-band, intermodulation results in the RF signal spectrum spreading out and rising up, referred to as spectral re-growth. Spectral re-growth may produce high-switching transients that may cause interference with adjacent time slots.

Turning now to FIG. 1, where a block diagram of prior art Power Control Loop (PCL) used in wireless communication systems, such as a GSM system, is illustrated and denoted generally as 10. PCL 10 comprises a Power Amplifier (PA) 12 having a RF input 14 for receiving RF input power $P_i$ and a RF output 16 for supplying an output power $P_o$. RF input power $P_I$ defined as a signal having a carrier frequency modulated with information and output power $P_o$ defined as the signal amplified by a pre-determined magnitude. PCL 10 comprises a variable attenuator 18 electrically coupled between RF input 14 and PA 12. Variable attenuator 18 comprises a control input 20 for receiving a control voltage $V_c$.

PCL 10 further comprises a coupler 22 electrically coupled to RF output 16 for coupling a portion of output power $P_o$ through a negative feedback path 24. PCL 10 further comprises a RF power detector 26 electrically coupled to coupler 22 for detecting a coupled power $E_i$. RF power detector 26 comprises a detector input electrically coupled to coupler 22 and a detector output containing a detected voltage $V_D$. Detected voltage $V_D$ is defined as a voltage proportional to the envelope of coupled power $E_i$. RF power detector 26 may comprise, for example, a detector circuit for detecting coupled power $E_i$, a filtering circuit for filtering the carrier frequency from the detected coupled power $E_f$, and converting circuitry for converting the filtered detected power to a voltage.

PCL 10 further comprises a comparator 28 having an inverting input 30 electrically coupled to the detector output containing detected voltage $V_D$ and a non-inverting input 32 containing a supplied reference voltage $V_R$. Supplied-reference voltage $V_R$, supplied by an external source such as a Digital Signal Processor or Applications Specific Integrated Circuit (ASIC), is a correct representation of output power $P_o$. Comparator 28 compares detected voltage $V_D$ and reference voltage $V_R$ and supplies the difference, an error voltage $V_E$, which is filtered through a loop filter 34. The filtered signal, a control voltage $V_c$, causes an increase or decrease in the attenuation level correcting any deviation in output power $P_o$.

FIG. 2 illustrates a prior art RF spectrum window denoted generally as 50. RF spectrum window 50 comprises a spectrum mask 52 and a RF signal spectrum 54. Spectrum mask 52 defines the boundaries of RF signal spectrum 54 defined by system requirements, that is, system requirements for a GSM 900 MHz transceiver. RF signal spectrum 54 is a measure of RF power $P_o$ at output 16. RF signal spectrum 54 illustrates the signal amplitude and phase-content changes with different power levels as a result of AM-AM and AM-PM conversions. As a result of changes in the signal phase content, RF signal spectrum 54 becomes asymmetrical beginning around 400 kHz offset from center. The negative feedback circuit corrects AM-AM intermodulation; however, AM-PM intermodulation is not corrected.

As may be seen, an improved apparatus to suppress odd-order harmonics generated as a result of AM-PM conversions could improve the linearity of a Power Amplifier (PA).

SUMMARY OF THE INVENTION

The present invention presents an improved apparatus for reducing AM-PM intermodulation affecting the RF signal spectrum at the output of a Power Amplifier (PA).

A Power Amplifier (PA exhibits on-linear characteristics as a result of Amplitude Modulation-Phase Modulation (AM-PM) conversion resulting in intermodulation. Intermodulation affects the RF signal spectrum at the output of the PA. The invention presents a method and apparatus for reducing intermodulation generated at the output of a PA as a result of AM-PM conversion. Presented is a RF power detector utilized in feedback control circuitry where the induction of odd-order harmonics into the feedback path acts to reduce AM-PM conversion.

The RF power detector comprises a detector input for receiving RF power and a detector output containing a pre-corrected, detected voltage. The pre-corrected, detected voltage comprises odd-order harmonics. The RF power detector further comprises a pre-correcting circuit for generating the odd-order harmonics at a specific power level. AM-PM conversions may significantly affect the RF signal spectrum at a specific power level. The pre-correcting circuit may be biased to generate odd-order harmonics at this specific power level.

BRIEF DESCRIPTION OF THE DRAWINGS:

For a more complete understanding of the present invention, including its features and advantages, reference is made to the detailed description of the invention, taken in conjunction with the accompanying drawings of which.

DETAILED DESCRIPTION OF THE INVENTION

While the use and implementation of particular embodiments of the present invention are presented in detail below, it will be understood that the present invention provides many inventive concepts which can be embodied in a wide variety of contexts. The specific embodiments discussed herein are mere illustrations of specific ways for making and using the invention and are not intended to limit the scope of the invention.

Figure 1:
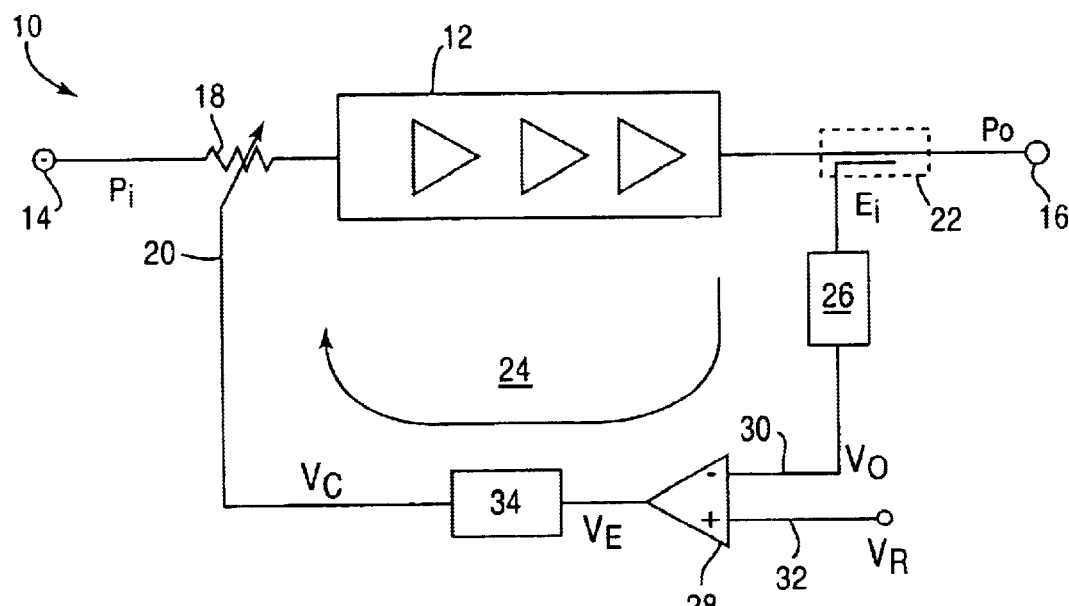
FIG. 1 is a block diagram of a prior art Power Control Loop (PCL)
Figure 2:
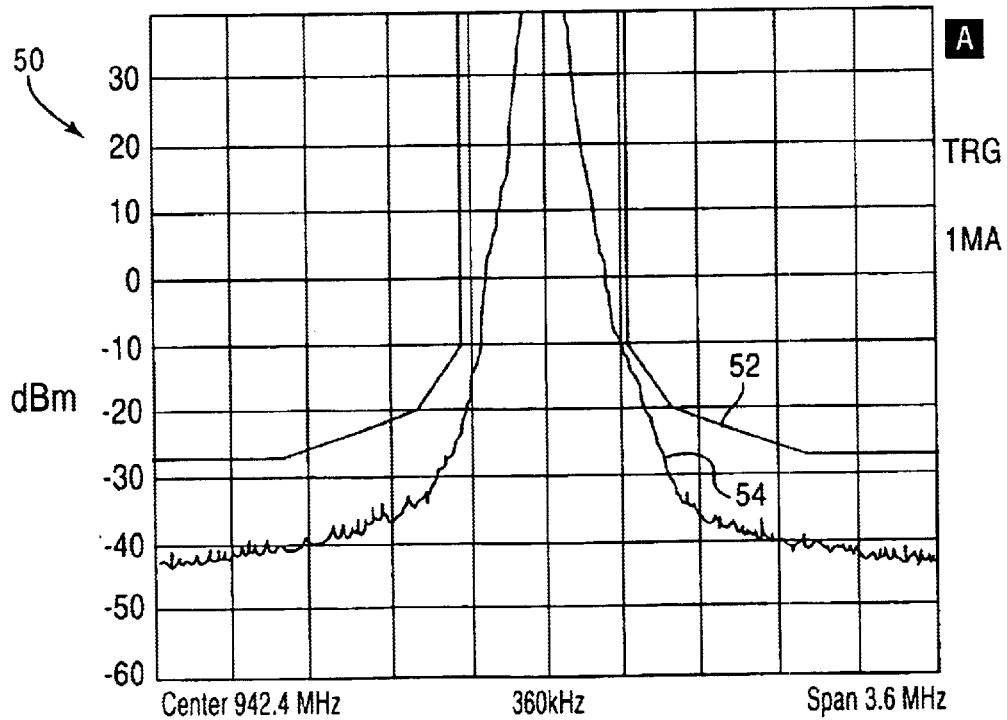
FIG. 2 is a prior art RF signal spectrum for a Power Amplifier (PA)
Figure 3:
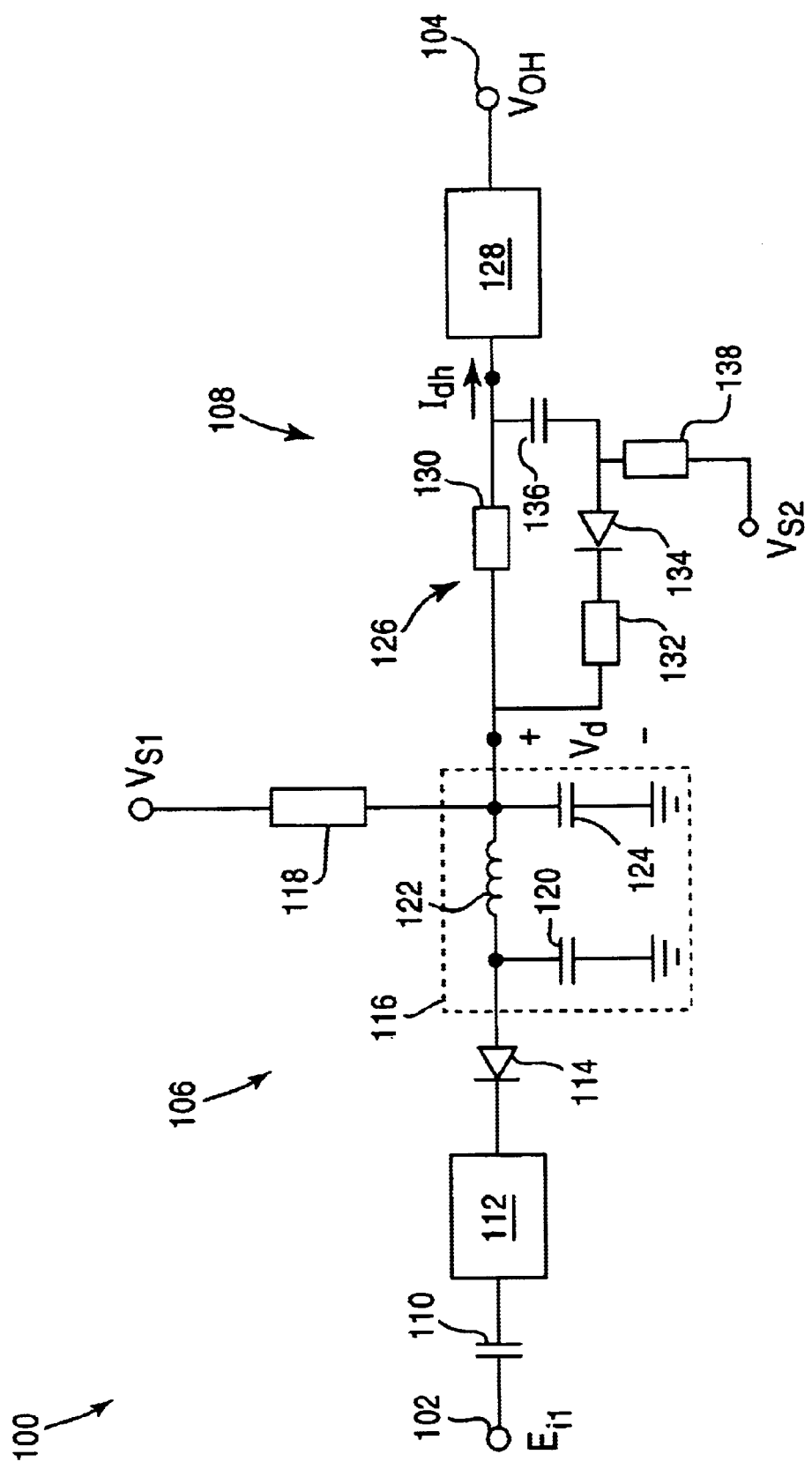
FIG. 3 is a block diagram of a RF power detector according to an embodiment of the invention.

Referring now to FIG. 3, where a block diagram of a RF power detector according to an embodiment is illustrated and denoted generally as 100. RF power detector 100 comprises a detector input 102 for receiving coupled power $E_{i1}$ comprising a carrier frequency modulated with information and a detector output 104 for supplying a pre-corrected detected voltage $V_{DH}$ representing the envelope and induced odd-order harmonics. RF power detector 100 further comprises detecting circuitry 106 for detecting and filtering the received coupled power $E_{i1}$ and a pre-correcting block 108 for pre-correcting the detected and filtered coupled power $E_{i1}$.

Detecting circuitry 106 comprises a DC blocking capacitor 1 10, an input-matching circuit 112, a diode 114 for detecting coupled power $E_{i1}$ and a filtering circuit 116 for filtering the carrier frequency from the envelope. Detecting circuitry 106 further comprises a bias voltage source $V_{s1}$ electrically coupled to diode 114 through a resistor 118 for biasing diode 114. Biasing diode 114 results in a detected voltage $V_d$ proportional to changes of coupled power $E_{i1}$. Filtering circuit 116 may comprise a capacitor 120, an inductor 122 and a capacitor 124 electrically coupled between diode 114 and pre-correcting block 108 in a pie configuration, although other configurations suitable for filtering may be utilized. Pre-correcting block 108 comprises a pre-corrector circuit 126 for generating odd-order harmonics and a converting circuit 128 for converting a pre-corrected detected current $I_{dh}$ into a pre-corrected detected voltage $V_{DH}$.

Pre-correcting circuit 126 comprises a resistor 130 disposed between filtering circuit 116 and converting circuit 128 and a loop circuit. The loop circuit comprises a first lead electrically coupled between filtering circuit 116 and resistor 130 and a second lead electrically coupled between resistor 130 and converting circuit 128. The pre-correcting circuit 126 induces harmonics into detected voltage $V_d$ resulting in pre-corrected detected current $I_{dh}$. The loop circuit comprises a resistor 132, a diode 134 and a capacitor 136. The loop circuit further comprises a bias voltage source $V_{s2}$ for supplying a bias voltage electrically coupled to the anode of diode 134 through a resistor 138.

Bias voltage source $V_{s2}$ remains constant while detected voltage $V_d$ changes proportionally with coupled power $E_{i1}$ causing diode 134 to open when rectified voltage $V_d$ reaches a specific voltage. The specific voltage may be defined as the voltage equivalent to a specific coupled power $E_{i1}$ where the pre-correction of detected voltage $V_d$ is required. Diode 134 when activated generates odd-order harmonics. Resistor 138 creates an AC voltage drop across diode 134 regulating the amount of odd-order harmonics generated. Resistor 132 and resistor 138 must be large enough to prevent pre-correcting circuit 126 from changing the magnitude of detected voltage $V_d$. Capacitor 136 blocks DC allowing diode 130 to generate non-DC harmonics and allows circulation of the generated odd-order harmonics.

Bias voltage source $V_{s2}$ and resistor 138 are configured according to coupled power $E_i$ at which linearization of detected voltage $V_d$ is required. For example, a Global System for Mobile (GSM) 900 MHz communications system has fifteen (15) different power levels over its frequency range. If linearization of detected voltage $V_d$ is required at 400 kHz offset center at an coupled power $E_{i1}$ of –10 dBm, appropriate values for bias voltage source $V_{s2}$ and resistor 138 are selected so that harmonics generation occurs at this level.

Converting circuit 128, which may be a logarithmic amplifier, compresses the DC bias signal and converts pre-corrected, detected current $I_{dh}$ into pre-corrected, detected voltage $V_{DH}$. Additional circuitry may be present in pre-correcting circuitry 108. For example, circuitry such as that found in A Precision Controlled Logarithmic Amplifier described in U.S. patent application Ser. No. 09/354,984 filed on Jul. 16, 1999 or the circuitry found in A Precision Controlled Detector Circuit described in U.S. patent application Ser. No. 09/399562 filed on Sep. 20, 1999. All inventions were invented by the same group of inventors.

Figure 4:
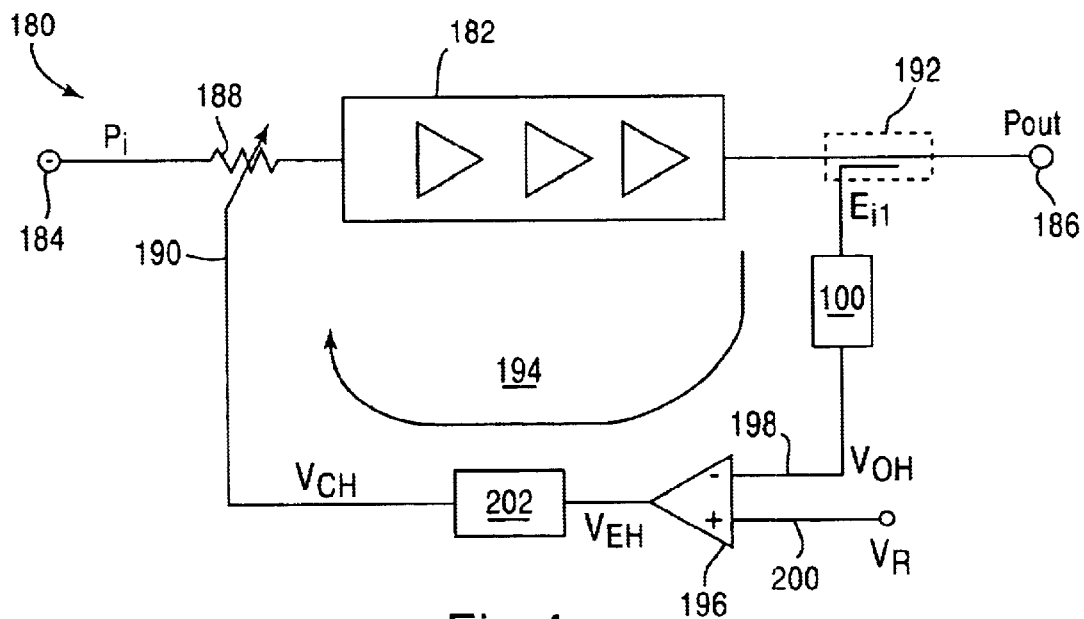
FIG. 4 is a block diagram of a Power Control Loop (PCL) utilizing the RF power detector as described with reference to FIG. 3.

Turning now to FIG. 4, where a block diagram of a Power Control Loop (PCL) utilizing RF power detector 100 is illustrated and denoted generally as 180. RF power detector 100 supplies pre-corrected detected voltage $V_{DH}$ at a desired power level. Pre-corrected, detected voltage $V_{DH}$ comprises a rich content of odd-order harmonics. The negative feedback control loop tries to compress AM-PM conversions as well as AM-AM conversions. As a result, the modulation envelope of the RF output has very low odd-order harmonics and thus low, inter-modulation level.

A Power Amplifier (PA) 182 is coupled to a RF input 184 for receiving RF input power $P_i$ and a RF output 186 for supplying a linearly amplified RF output power $P_{out}$. PCL 180 comprises a variable attenuator 188 electrically coupled between RF input 184 and PA 182. Variable attenuator 188 comprises a control-signal input 190 for receiving a control voltage.

PCL 180 further comprises a coupler 192 electrically coupled to RF output 186 for coupling a portion of linearly amplified output power $P_{out}$ through a negative feedback path 194. RF power detector 100 comprising detector circuitry 106 and pre-correcting block 108 converts coupled power $E_{i1}$ to pre-corrected detected voltage $V_{DH}$. A comparator 196 having a inverting input 198 and a non-inverting input 200 is electrically coupled to RF power detector 100 containing pre-corrected detected voltage $V_{DH}$ and a supplied reference voltage source containing a reference voltage $V_{R1}$. Reference voltage $V_{R1}$, which may be supplied by an external source such as a Digital Signal Processor or Applications Specific Integrated Circuit (ASIC), is a correct representation of output power $P_{out}$. Comparator 196 compares pre-corrected detected voltage $V_{DH}$ and reference voltage $V_{R1}$ and supplies a error signal $V_{EH}$, which is filtered for unwanted frequencies through a loop filter 202. The filtered signal, a control signal $V_{CH}$, supplied to control signal input 190 adjusts the attenuation level suppressing odd-order harmonics generated by PA 182, effectively eliminating in-band inter-modulation.

Figure 5:
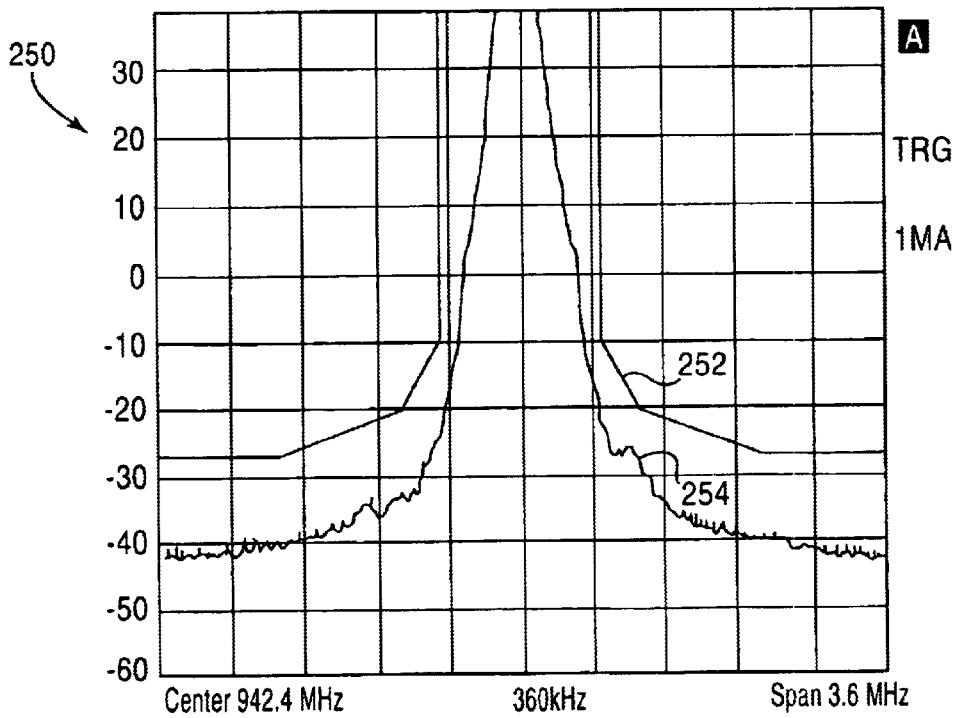
FIG. 5 is a RF signal spectrum of the PCL as described with reference to FIG. 4.

Turning now to FIG. 5, where a RF spectrum window is illustrated and denoted generally as 250. RF spectrum window 250 comprises a spectrum mask 252 and a RF signal spectrum 254. Spectrum mask 252 defines the boundaries of RF signal spectrum 254 defined by system requirements, for example, system requirements for GSM 900 MHz transceiver. RF signal spectrum 254 is a measure of linearly amplified output power $P_{out}$ at output 186. RF signal spectrum 254 illustrates that the spectrum content remains quite linear over all power levels in spite of the AM-PM conversions of PA 182. As a result of the linearization of the signal phase content, RF signal spectrum 254 becomes more symmetrical.

While this invention has been described with reference to particular embodiments, this description is not intended to be limiting. Various modifications and combinations of the illustrative embodiments, as well as other embodiments of the invention, will be apparent to persons skilled in the art. It is, therefore, intended that the appended claims encompass any such modifications or embodiments.

What is claimed is:

1. A RF power detector comprising:
   a detector input for receiving RF power, the RF power comprising a carrier frequency having modulated information;
   a detector output for providing a pre-corrected, detected voltage, the pre-corrected detected, voltage comprising a voltage representing the modulated information and odd-order harmonics; and
   a pre-correcting circuit for generating the odd-order harmonics, the pre-correcting circuit electrically coupled between the detector input and the detector output.

2. The RF power detector as recited in claim 1 further comprising a diode for detecting the received RF power, the diode electrically coupled between the RF input and the pre-correcting circuit.

3. The RF power detector as recited in claim 2 further comprising a DC blocking capacitor electrically coupled between the RF input and the diode.

4. The RF power detector as recited in claim 3 further comprising an input-matching circuit, electrically coupled between the DC blocking capacitor and the diode.

5. The RF power detector as recited in claim 2 further comprising a filtering circuit for filtering the carrier frequency from the detected RF power, the filtering circuit electrically coupled between the diode and the pre-correcting circuit.

6. The RF power detector as recited in claim 1 further comprising a converting circuit for converting a pre-corrected, detected current delivered by the pre-correcting circuit to the pre-corrected, detected voltage, the converting circuit electrically coupled between the pre-correcting circuit and the detector output.

7. The RF power detector as recited in claim 6, wherein the pre-correcting circuit further comprises:
   a first resistor electrically coupled between the filtering circuit and the converting circuit; and
   a loop circuit having a first lead electrically coupled between the filtering circuit and the first resistor, and a second lead electrically coupled between the first resistor and the converting circuit (the loop circuit comprising a second resistor), a diode, and a capacitor electrically connected in series and a bias voltage source electrically coupled between the diode and the capacitor through a third resistor.

8. A Power Control Loop (PCL) comprising:
   an amplifier having an RF input for receiving an RF signal and an RF output for supplying a linearly amplified RF signal;
   a negative, feedback-control circuit comprising an input coupled to the RF output and a output coupled to the RF input for controlling the attenuation level of the RF input; and
   a RF power detector comprising a detector input for detecting a coupled portion of the linearly amplified RF signal and a detector output, the RF power detector further comprising a pre-correcting circuit for inducing odd-order harmonics into the detected RF signal at a pre-determined power level to provide a pre-corrected detected voltage at said detector output.

9. The PCL as recited in claim 8, wherein the negative, feedback-control circuit further comprises a comparator for providing a differential voltage, the differential voltage indicating the difference between the pre-corrected detected voltage and a reference voltage, the reference voltage indicating a correct representation of the linearly amplified output power.

10. The PCL as recited in claim 9, wherein the negative, feedback-control circuit further comprises a filter circuit for filtering unwanted frequencies, the filter circuit having an input for receiving the differential voltage and a output containing a control voltage.

11. The PCL as recited in claim 10 further comprising a variable attenuator disposed between the RF input and the PA, the variable attenuator having a control signal input for receiving the control voltage.

12. The PCL as recited in claim 8, wherein the RF power detector further comprises:
   a diode electrically coupled between the input and the pre-correcting circuit;
   a input matching circuit for impedance-matching control, the input-matching circuit electrically coupled between the diode and the input;
   a filtering circuit for filtering unwanted frequencies, the filtering circuit electrically coupled between the diode and the pre-correcting circuit; and
   a converting circuit for converting a pre-correcting current delivered by the pre-correcting circuit into the pre-corrected detected voltage, the converting circuit electrically coupled between the pre-correcting circuit and the output.

13. The RF power detector as recited in claim 12, wherein the pre-correcting circuit further comprises:
   a first resistor electrically coupled between the filtering circuit and the converting circuit; and
   a loop circuit having a first lead electrically coupled between the filtering circuit and the first resistor and a second lead electrically coupled between the first resistor and the converting circuit, the loop circuit comprising a second resistor, a diode, and a capacitor electrically connected in series and a bias voltage source electrically coupled between the diode and the capacitor through a third resistor.

14. A method of reducing inter-modulation generated as a result of AM-PM conversions at the output of a Power Amplifier (PA), the method comprising the steps of:

detecting a portion of output power from the output of the PA;

selectively inducing odd-order harmonics into the detected portion of output power; and adjusting an input power to the PA to compensate for intermodulation as a result of AM-PM conversion.

15. The method of reducing intermodulation as recited in claim 14 further comprising the step of comparing the detected portion of output power with a reference signal, the reference signal being a correct representation of the output power.

16. The method of reducing intermodulation as recited in claim 15 further comprising the step of filtering unwanted frequencies from the difference between the detected portion of output power and reference signal.

* * * * *